United States Patent
Ahlquist

(10) Patent No.: US 8,725,959 B2
(45) Date of Patent: May 13, 2014

(54) SYSTEMS AND METHODS FOR INTERNAL INITIALIZATION OF A NONVOLATILE MEMORY

(71) Applicant: Micron Technology, Inc., Boise, ID (US)

(72) Inventor: Brent Ahlquist, Loomis, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/691,338

(22) Filed: Nov. 30, 2012

(65) Prior Publication Data
US 2013/0091336 A1    Apr. 11, 2013

Related U.S. Application Data

(63) Continuation of application No. 12/347,962, filed on Dec. 31, 2008, now Pat. No. 8,327,087.

(51) Int. Cl.
*G06F 12/06* (2006.01)
*G06F 12/14* (2006.01)

(52) U.S. Cl.
USPC ........... 711/154; 711/103; 711/104; 711/163; 711/170; 711/173

(58) Field of Classification Search
USPC ................. 711/103, 104, 154, 163, 170, 173
See application file for complete search history.

(56) References Cited

U.S. PATENT DOCUMENTS

| | | | |
|---|---|---|---|
| 8,478,959 B1 * | 7/2013 | Wyatt | 711/163 |
| 2004/0243783 A1 | 12/2004 | Ding et al. | |
| 2007/0061500 A1 | 3/2007 | Gould et al. | |
| 2008/0010418 A1 | 1/2008 | Kao | |

OTHER PUBLICATIONS

Microchip Technology, Inc.,PIC32MX3XX/4XX Family Data Sheet, [online] Jul. 2008. Retrieved from the Internet <URL: http://pdf1.alldatasheet.com/datasheet-pdf/view/216936/MICROCHIP/PIC32MX.html>.
Hoffman, Hans-Peter, "SysM-Based Systems Engineering Using a Model-Driven Development Approach", SST'S New SQI Flash Family Raises Performance Levels for Serial Flash Memory, © MMIX Embedded Computing Design, posted online May 2008, 6 pages [online]. Retrieved from the Internet <URL: http://www.embedded-computing.com/news/db/?11112>. Retrieved on Jan. 27,2009.
Jedec, Solid Statement Technology Association, Committee Letter Ballot, Committee JC42.6, Committee Item No. 1725.01, Subject: LPDDR2 Draft Spec, Jun.-Aug. 2008,243 pages.
USPTO; Office Action dated Aug. 30, 2011, from related application U.S. Appl. No. 12/347,962, filed Dec. 31, 2008.
USPTO; Office Action dated Jan. 17, 2012, from related application U.S. Appl. No. 12/347,962, filed Dec. 31, 2008.

* cited by examiner

*Primary Examiner* — Arpan P. Savla
(74) *Attorney, Agent, or Firm* — Knobbe Martens Olson & Bear LLP

(57) ABSTRACT

Methods and systems are provided that may include a memory device having a physical nonvolatile memory, a memory space, and a controller. At least a portion of a physical nonvolatile memory may permit a direct read operation of the physical nonvolatile memory and prohibit a direct write operation of the physical nonvolatile memory. A memory space may comprise at least open one write overlay window available after a reset operation. Such a memory space may be adapted to permit at least one read overlay window to be opened that is logically separate from at least one open write overlay window. A controller may be included to open at least one read overlay window.

17 Claims, 2 Drawing Sheets

SYSTEMS AND METHODS FOR INTERNAL INITIALIZATION OF A NONVOLATILE MEMORY

CROSS-REFERENCE TO RELATED APPLICATION

This application is a continuation application of U.S. application Ser. No. 12/347,962, filed Dec. 31, 2008, now U.S. Pat. No. 8,327,087, the entirety of which is incorporated by reference herein.

BACKGROUND

1. Field

The subject matter disclosed herein relates to a nonvolatile memory.

2. Information

Nonvolatile memory devices, such as Phase-Change Memory ("PCM"), flash memory, or Electrically Erasable Programmable Read-Only Memory ("EEPROM") are sometimes packaged within an electrical system. For example, such nonvolatile memory devices may be sold within a computer system or a digital camera, for example. Such nonvolatile memory devices may be coupled to a bus and data may be transmitted over such a bus from a processor to a nonvolatile memory device for storage, for example.

Information such as data or program code may be transmitted over a bus to a nonvolatile memory, where it may be written for storage. Similarly, information may be read, or retrieved, from a nonvolatile memory and transmitted over a bus to an electronic component such as a processor.

BRIEF DESCRIPTION OF THE DRAWINGS

Non-limiting and non-exhaustive aspects are described with reference to the following figures, wherein like reference numerals refer to like parts throughout the various figures unless otherwise specified.

DETAILED DESCRIPTION

Figure 1:
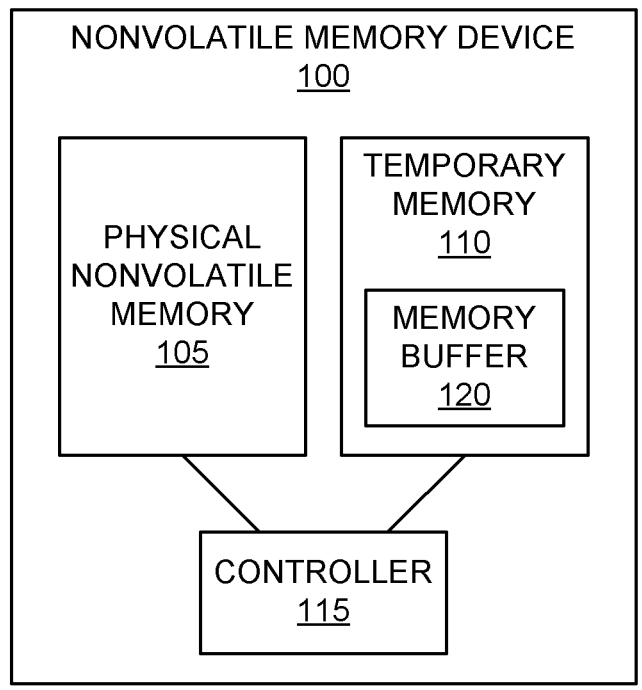
FIG. 1 illustrates a nonvolatile memory device according to one implementation.

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail so as not to obscure the claimed subject matter.

Nonvolatile memory devices, such as Phase-Change Memory ("PCM"), flash memory, or Electrically Erasable Programmable Read-Only Memory ("EEPROM") devices are sometimes packaged within an electrical system. For example, such nonvolatile memory devices may be utilized within a computer system or in an electronic device such as a digital camera or personal digital assistant (PDA), for example. Such nonvolatile memory devices may be coupled to a bus and data may be transmitted over such a bus from a processor or other electronic component to such nonvolatile memory devices for storage.

In one implementation, some nonvolatile memory devices may not allow data received via a bus, for example, to be written directly to a physical nonvolatile memory. Instead, data may be written indirectly to a nonvolatile memory device—for example, data may be written to a memory buffer. A controller or processor within such a nonvolatile memory device may subsequently transfer such data from such a memory buffer to such a physical nonvolatile memory.

Data, for example, may be written to a memory buffer of a temporary memory device, such as static random access memory (SRAM) within a nonvolatile memory device, and may be subsequently moved into underlying physical nonvolatile memory. It may be faster to write information to SRAM than it would be to write to such information directly to a physical nonvolatile memory. SRAM may be likewise used to store data required by a non-volatile memory device that uses a write overlay window as a command interface.

If data is moved across a bus to a nonvolatile memory device, for example, certain protocols may be followed. If data for a write operation were sent directly to a nonvolatile memory device, such data may not be written to such a non-volatile memory device. In current systems, if a write request is transmitted over a bus from a processor or other system electronic component to a nonvolatile memory, nothing will be written to such a nonvolatile memory unless an overlay window has been opened prior to such a write operation being transmitted to the nonvolatile memory device. A reason for this is because nonvolatile memory devices in current use do not permit direct write operations. In current systems, an overlay window containing a memory buffer is by default closed and must be opened within the nonvolatile memory device; only then can such data received from a bus be written to such a memory buffer of a nonvolatile memory device.

In one implementation, a nonvolatile memory device may use a single overlay window which can handle write operations to a memory buffer, direct reads, and status and command interfaces.

According to one implementation, as discussed herein, a number of separate overlay window(s) may be utilized for one or more write operations versus overlay window(s) used for one or more read operations. A "write operation" may refer to a physical bus transaction of the type "write." A "read operation," on the other hand, may refer to a physical bus transaction of the type "read." Accordingly, the same command, but with different "types," may be utilized for a read or a write operation. An implementation, as discussed herein, may provide a method and system for reading from and writing to a nonvolatile memory-specific memory device Command and Status interface independent of the nonvolatile memory device's physical interface standard. For example, in some current systems, a protocol-specific command associated with a physical interface may have to be provided to a nonvolatile memory device in order to cause the nonvolatile memory device to open an overlay window. In such current systems, read operations and write operations may be performed within the same overlay window. Accordingly, in the event that, for example, command response information stored in a register is to be read, an entire overlay window may be opened. Moreover, if information is to be written to a memory buffer, the same overlay window would need to be opened.

In one implementation where a nonvolatile memory sits behind a standard memory bus, such as a Low Power Double Data Rate Nonvolatile Memory (LPDDR-NVM) bus, in order to instruct a nonvolatile memory device to open an overlay window, a processor may send an LPDDR-NVM protocol-specific instruction over a bus to a nonvolatile memory device. This protocol may not be found in a standard bus interface specification but may instead be defined specifically for a nonvolatile memory's operation. For example, in the event that the bus is an LPDDR-NVM bus, a different instruction may be transmitted than would be transmitted if a double data rate (DDR) bus, or if a bus according to a different protocol were used. A problem may arise because a bus may be specified by a standards body, and a manufacturer of a nonvolatile memory device may have to request such a standards body to create a protocol-specific command to cause such a nonvolatile memory device to open an overlay window. A problem with using such protocol-specific commands is that a standards body may have to be petitioned in order to create such a protocol-specific command.

According to one particular implementation, a nonvolatile memory device may include at least one overlay window specifically data inbound to the nonvolatile device or write overlay window. Such a nonvolatile memory device may also include at least one overlay window specifically for data outbound from the nonvolatile device or read overlay window. Such write and read overlay windows may overlap in terms of physical address location, but may, however, be treated as separate portals. In other words, at least one write overlay window does not share any physical registers or space in memory with at least one read overlay window. Accordingly, at least one write overlay window may therefore be logically separate from at least one read overlay window. If a nonvolatile memory device does not support direct write operations to the underlying nonvolatile memory core, one or more write overlay windows may remain permanently opened in such a nonvolatile memory device. In the event that a write command is received by a nonvolatile memory device, information for such a write command may be written to one or more write overlay windows without a nonvolatile memory device having to first explicitly open a write overlay window.

If a nonvolatile memory supports direct write operations, a nonvolatile memory-specific command may close an underlying write overlay window prior to such a direct write capability being made available. A device may start with all write overlay windows initially open prior to be closed by one or more nonvolatile specific commands to a write overlay window to close the overlay window(s) and enable direct write operations to an underlying physical nonvolatile memory if that capability is available.

Because a write overlay window does not have to be explicitly opened prior to a write operation, there may therefore be no requirement that a protocol-specific command be created to open such an overlay window. In order to subsequently open a read overlay window, for example, certain information may be written to a write overlay window. For example, information may be written to a particular register of a write overlay window and writing to such a register may cause an internal controller or processor of a nonvolatile memory device to subsequently perform a process to open a read overlay window.

FIG. 1 illustrates a nonvolatile memory device 100 according to one implementation. As shown, nonvolatile memory device 100 may include several elements, such as a physical nonvolatile memory 105, a temporary memory 110, and a controller 115. Nonvolatile memory device 100 may comprise, for example, a flash memory, Phase-Change Memory ("PCM"), or Electrically Erasable Programmable Read-Only Memory ("EEPROM").

Physical nonvolatile memory 105 may comprise cells to which information, such as data or program code, for example, may be stored. Temporary memory 110 may comprise a temporary memory device such as, for example, a static random access memory (SRAM). Temporary memory 110 may comprise a memory buffer 120. A memory buffer 120 may include a memory space in which one or more read overlay windows and/or write overlay windows may be presented.

Controller 115 may be adapted to perform certain functions within nonvolatile memory device 100 such as, for example, opening at least one read overlay window. Moreover, controller 115 may also have another function of moving at least some information stored in temporary memory 110 over to physical nonvolatile memory 105. Although controller 115 is shown in FIG. 1, it should be appreciated that controller 115 may perform a range of processes such that controller 115 may also be referred to as a processor.

Figure 2:
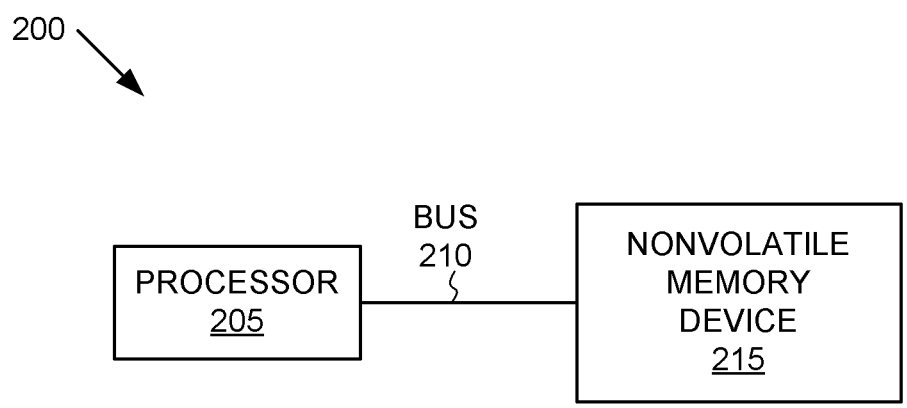
FIG. 2 illustrates an electronic system according to one implementation.

FIG. 2 illustrates an electronic system 200 according to one implementation. Electronic system may include a processor 205, a bus 210, and a nonvolatile memory device 215. Processor 205 may be adapted to generate a read command to read data or other information from nonvolatile memory device 215, and to generate a write command to write data or other information to nonvolatile memory device 215. Processor 205 may transmit a read and/or write command across bus 210 to nonvolatile memory device 215. As discussed herein, nonvolatile memory device 215 may permit a direct read operation, such that information may be read directly from a physical nonvolatile memory by an electronic device external to nonvolatile memory device 215, such as processor 205 in this example. Nonvolatile memory device 215 may also prohibit a direct write operation, whereby information may not be written directly to a physical nonvolatile memory by an electronic device external to nonvolatile memory 215, such as processor 205.

Nonvolatile memory device 215 may include both a physical nonvolatile memory and a temporary memory, such as those discussed above with respect to FIG. 1. When a write command is received, information may be written to a write overlay window within a buffer of a temporary memory, as discussed below with respect to FIG. 3.

Figure 3:
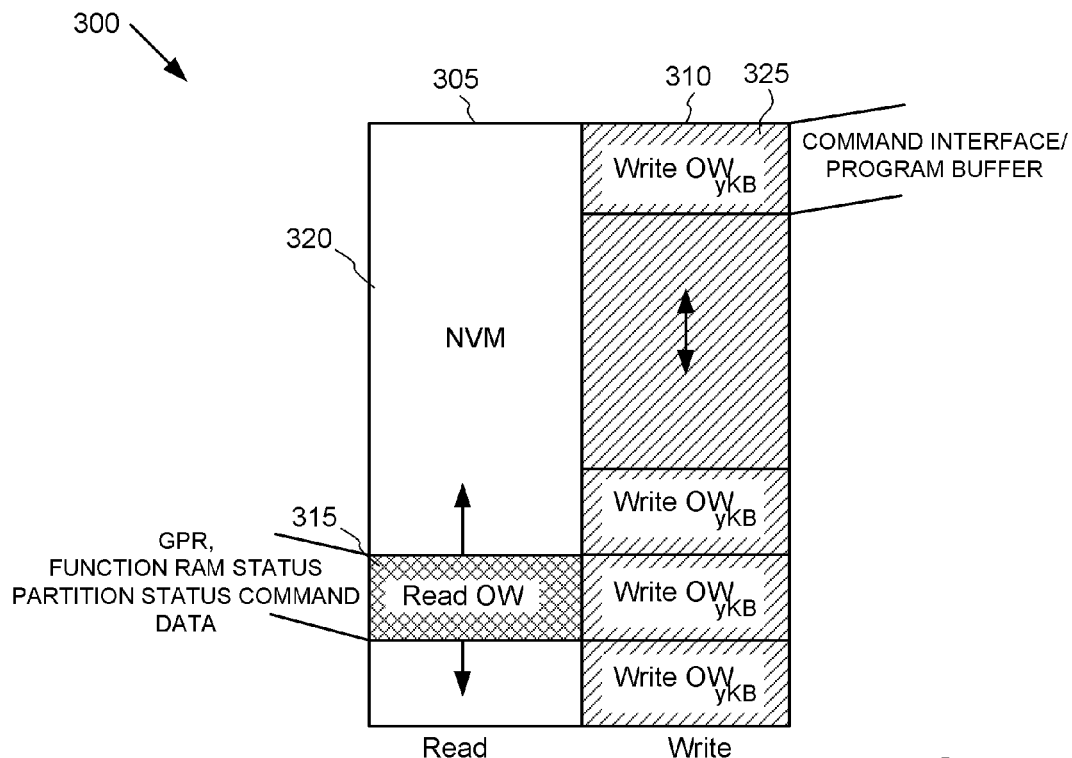
FIG. 3 illustrates a non-volatile memory device having two separate overlay window types, a read overlay window and a write overlay window, according to one implementation.

FIG. 3 illustrates a memory space 300 for a non-volatile memory device having two separate overlay window types, a read overlay window and a write overlay window, according to one implementation. Each overlay window type may be logically separate but may reside in the same memory space according to one implementation. Memory space 300 may include read overlay window registers 305 and write overlay window registers 310. In read overlay window space 305, for example, at least one read overlay window 315 may be present. In this example, read overlay window 315 may provide access to Command Response Data, Command Status, Device Status, or any outbound data that may be registered and accessed via the read overlay window. Such status information may indicate, for example, information associated with various particulars of a nonvolatile memory, whether certain commands have been executed, how RAM is partitioned, and whether errors have occurred, for example.

In the example shown in FIG. 3, information may be read directly from a read overlay window 315 or from a physical nonvolatile memory 320. Physical nonvolatile memory 320 may be adapted to store program code, for example, among other types of information. Information can be read directly from physical nonvolatile memory 320 if a read overlay window 315 is not already open. In the event that a read overlay window 315 is open, such a read overlay window 315 may be closed to allow information to be read from physical nonvolatile memory 320. On the other hand, if information is to be read from a read overlay window 315, such a read overlay window 315 would need to remain open during execution of a read process.

The write overlay window registers 310 may be accessed via one or more of the open write overlay windows 325. An initial state of device nonvolatile memory device at reset is such that the entire memory space may be tiled with open write overlay windows. It is only by subsequent nonvolatile memory commands to an open write overlay window that select write overlay windows may be closed in order to leave only certain desired overlay window location open. A process, as discussed herein, may be related to initialization of a nonvolatile memory device. Each of the write overlay windows 325 may be utilized to store information received from an external device, such as processor 205 of FIG. 2. There may be multiple write overlay windows. Use of multiple overlay windows after initialization during a boot process may be a choice of a nonvolatile memory device. "Host," as used herein, may refer to a master device that issues commands or accesses a non-volatile memory's capabilities. A write overlay window 325 may also include a command interface and/or a program buffer.

In one implementation, one or more write overlay windows 325 may remain open because a direct write to underlying physical nonvolatile memory is not permitted. On the other hand, one or more read overlay windows may or may not be open at a particular time, e.g., in order to allow read access to an underlying physical nonvolatile memory, because a direct read from underlying physical nonvolatile memory is permitted. Multiple read overlay windows may be valuable if there are multiple virtual masters using a non-volatile memory each with their own memory space partitioned. In order to open a read overlay window, a write overlay window command or protocol may need to be issued or followed, which may cause an internal controller or processor in such a non-volatile memory device to open one or more read overlay windows.

Figure 4:
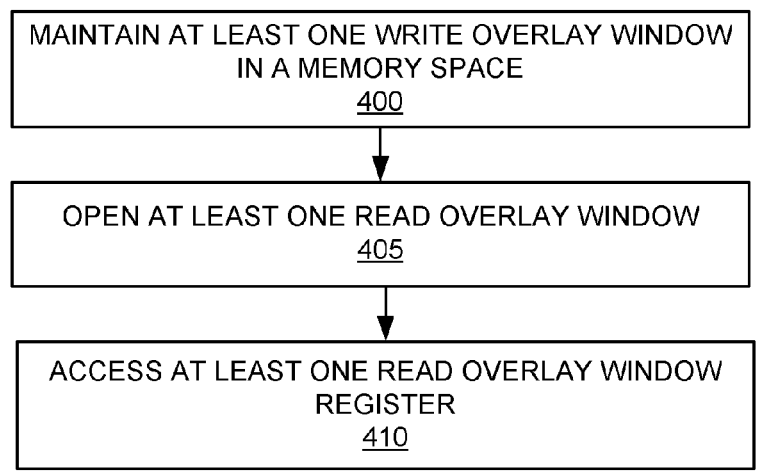
FIG. 4 illustrates a process for implementing read and write overlay windows according to one implementation.

FIG. 4 illustrates a process for implementing read and write overlay windows according to one implementation. First, at operation 400, at least one write overlay window is maintained in a memory space of a memory device comprising at least the memory space and a nonvolatile memory. At least a portion of the nonvolatile memory may permit a direct read operation while prohibiting a direct write operation. Next, at operation 405, at least one read overlay window is opened. At least one read overlay window may be logically separate from the at least one write overlay window. At operation 410, at least one read overlay window register may be accessed.

In accordance with FIG. 4, it should be appreciated that a nonvolatile memory device may have an ability to keep at least one write overlay window in its default open state from all tiled write overlay windows. Only a single read overlay window may ever need to be opened for communicating via a command issued to a write overlay window.

Such a method and system, as discussed herein, may provide flexibility for manufacturers and users of nonvolatile memory devices. Specifically, such nonvolatile memory devices may be utilized in a variety of systems and information may be written to or read from such nonvolatile memory devices without having to utilize protocol-specific commands to open a write overlay window. Moreover, by segregating a write overlay window from a read overlay window, a permanently-opened write overlay window may be utilized.

Some portions of the detailed description which follow are presented in terms of algorithms and/or symbolic representations of operations on data bits or binary digital signals stored within a computing system memory, such as a computer memory. These algorithmic descriptions and/or representations are the techniques used by those of ordinary skill in the data processing arts to convey the substance of their work to others skilled in the art. An algorithm is here, and generally, considered to be a self-consistent sequence of operations and/or similar processing leading to a desired result. The operations and/or processing involve physical manipulations of physical quantities. Typically, although not necessarily, these quantities may take the form of electrical and/or magnetic signals capable of being stored, transferred, combined, compared and/or otherwise manipulated. It has proven convenient at times, principally for reasons of common usage, to refer to these signals as bits, data, values, elements, symbols, characters, terms, numbers, numerals and/or the like. It should be understood, however, that all of these and similar terms are to be associated with the appropriate physical quantities and are merely convenient labels. Unless specifically stated otherwise, as apparent from the following discussion, it is appreciated that throughout this specification discussions utilizing terms such as "processing", "computing", "calculating", "associating", "identifying", "determining" and/or the like refer to the actions and/or processes of a computing platform, such as a computer or a similar electronic computing device, that manipulates and/or transforms data represented as physical electronic and/or magnetic quantities within the computing platform's memories, registers, and/or other information storage, transmission, and/or display devices.

While certain exemplary techniques have been described and shown herein using various methods and systems, it should be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all implementations falling within the scope of the appended claims, and equivalents thereof.

What is claimed is:

1. An apparatus comprising:
  a nonvolatile memory device comprising:
    a physical nonvolatile memory; and
    a controller in communication with the physical nonvolatile memory, wherein upon initialization, the controller is configured to open at least one write overlay window for an address space of the physical nonvolatile memory such that the at least one write overlay window implements a status and command interface for a host;
  wherein for a first address space within an address space of the physical nonvolatile memory, the controller is further configured to permit a direct read operation from the physical nonvolatile memory and to open a second write overlay window for a write operation upon initialization; and
  wherein for a second address space within the address space of the physical nonvolatile memory, the second address space being different from the first address space, the controller is further configured to open a first read overlay window for a read operation and to open a third write overlay window for a write operation upon initialization.

2. The apparatus of claim 1, wherein the controller is configured to receive one or more commands via the at least one write overlay window.

3. The apparatus of claim 1, wherein the controller is configured to open all write overlay windows upon initialization.

4. The apparatus of claim 3, wherein the controller is configured to close one or more write overlay windows in response to a command received via the at least one write overlay window.

5. The apparatus of claim 1, further comprising a temporary memory in communication with the controller.

6. The apparatus of claim 5, wherein the temporary memory comprises a static random access memory (SRAM).

7. The apparatus of claim 6, wherein the controller is configured to receive information in an open write overlay window, store the information in the temporary memory, and write the information to the physical nonvolatile memory.

8. The apparatus of claim 1, wherein the controller is further configured to open at least one read overlay window upon initialization, wherein the at least one read overlay window is configured to provide at least command response data.

9. A method of configuring a nonvolatile memory device, wherein the nonvolatile memory device comprises a physical nonvolatile memory and a temporary memory, the method comprising:
   internally initializing the nonvolatile memory device upon a start such that at least one write overlay window for an address space of the physical nonvolatile memory is open after initialization, wherein the at least one write overlay window is configured to implement a status and command interface for a host, wherein internally initializing further comprises:
      for a first address space within an address space of the physical nonvolatile memory, permitting a direct read operation from the physical nonvolatile memory and opening a second write overlay window for a write operation; and
      for a second address space within the address space of the physical nonvolatile memory, the second address space being different from the first address space, opening a first read overlay window for a read operation and opening a third write overlay window for a write operation; and
   receiving one or more commands via the at least one write overlay window.

10. The method of claim 9, further comprising opening all write overlay windows upon initialization.

11. The method of claim 10, further comprising closing one or more write overlay windows in response to a command received via the at least one write overlay window.

12. The method of claim 9, further comprising:
receiving information in an open write overlay window;
storing the information in a temporary memory; and
writing the information to the physical nonvolatile memory.

13. A system comprising:
a processing element configured to issue at least one of a read operation, a write operation, a status request, or a command;
a memory device comprising:
   a physical nonvolatile memory; and
   and a controller configured to open at least one write overlay window upon initialization for an address space of the physical nonvolatile memory such that the at least one write overlay window implements a status and command interface for the processing element; and
a bus configured to carry information associated with the at least one of the read operation, the write operation, the status request, or the command;
wherein for a first address space within the address space of the physical nonvolatile memory, the controller is further configured to permit a direct read operation from the physical nonvolatile memory and to open a second write overlay window for a write operation upon initialization; and
wherein for a second address space within the address space of the physical nonvolatile memory, the second address space being different from the first address space, the controller is further configured to open a first read overlay window for a read operation and to open a third write overlay window for a write operation upon initialization.

14. The system of claim 13, wherein the controller is configured to open all write overlay windows of the memory device upon initialization.

15. The system of claim 14, wherein the controller is configured to close one or more write overlay windows in response to a command received from the processing element via the at least one write overlay window and the bus.

16. The system of claim 13, wherein the controller is configured to receive information in an open write overlay window, store the information in a temporary memory, and write the information to the physical nonvolatile memory.

17. The system of claim 13, wherein the controller is further configured to open at least one read overlay window upon initialization, wherein the at least one read overlay window is configured to provide at least command response data.

* * * * *